(12) United States Patent
Pandey et al.

(10) Patent No.: US 10,490,483 B2
(45) Date of Patent: Nov. 26, 2019

(54) LOW CAPACITANCE THROUGH SUBSTRATE VIA STRUCTURES

(71) Applicant: MICRON TECHNOLOGY, INC., Boise, ID (US)

(72) Inventors: Deepak C. Pandey, Boise, ID (US); Haitao Liu, Boise, ID (US); Chandra Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/062,675

(22) Filed: Mar. 7, 2016

(65) Prior Publication Data
US 2017/0256490 A1     Sep. 7, 2017

(51) Int. Cl.
*H01L 23/48* (2006.01)
*H01L 23/538* (2006.01)
*H01L 21/768* (2006.01)
*H01L 23/532* (2006.01)

(52) U.S. Cl.
CPC ...... *H01L 23/481* (2013.01); *H01L 21/76898* (2013.01); *H01L 23/5384* (2013.01); *H01L 23/53233* (2013.01); *H01L 23/53238* (2013.01); *H01L 23/53252* (2013.01); *H01L 23/53271* (2013.01); *H01L 2223/6622* (2013.01)

(58) Field of Classification Search
None
See application file for complete search history.

(56) References Cited

U.S. PATENT DOCUMENTS

| 2003/0157748 | A1 | 8/2003 | Kim et al. |
| 2006/0001174 | A1* | 1/2006 | Matsui ............ H01L 21/76898 257/774 |
| 2006/0043572 | A1 | 3/2006 | Sugimoto et al. |
| 2007/0222021 | A1* | 9/2007 | Yao ................ H01L 23/481 257/499 |
| 2009/0093100 | A1 | 4/2009 | Xia et al. |
| 2010/0176494 | A1* | 7/2010 | Chen ............... H01L 21/76898 257/621 |
| 2010/0270593 | A1 | 10/2010 | Lung et al. |

(Continued)

FOREIGN PATENT DOCUMENTS

| JP | 2006019455 A | 1/2006 |
| JP | 2006261403 A | 9/2006 |

(Continued)

OTHER PUBLICATIONS

OpenStax, Capacitors in Series and Parallel, version 1.4, Nov. 10, 2014.*

(Continued)

*Primary Examiner* — Steven B Gauthier
(74) *Attorney, Agent, or Firm* — Dorsey & Whitney LLP

(57) ABSTRACT

Apparatuses and methods are disclosed herein for the formation of low capacitance through substrate via structures. An example apparatus includes an opening formed in a substrate, wherein the opening has at least one sidewall, a first dielectric at least formed on the sidewall of the opening, a first conductor at least formed on the first dielectric, a second dielectric at least formed on the first conductor, and a second conductor at least formed on a sidewall of the second dielectric.

6 Claims, 6 Drawing Sheets

(56) References Cited

U.S. PATENT DOCUMENTS

| | | | | |
|---|---|---|---|---|
| 2011/0241040 A1* | 10/2011 | Yu | .................... | H01L 21/6835 |
| | | | | 257/91 |
| 2011/0291287 A1* | 12/2011 | Wu | .................. | H01L 21/76898 |
| | | | | 257/774 |
| 2012/0258589 A1* | 10/2012 | Volant | .............. | H01L 21/76898 |
| | | | | 438/653 |
| 2015/0255372 A1* | 9/2015 | Kamgaing | ............ | H01L 23/481 |
| | | | | 257/415 |

FOREIGN PATENT DOCUMENTS

| | | | |
|---|---|---|---|
| JP | 2008066601 A | 3/2008 |
| JP | 2011222993 A | 11/2011 |
| JP | 2012009820 A | 1/2012 |
| JP | 2014038904 A | 2/2014 |

OTHER PUBLICATIONS

OpenStax, Capacitors in Series and Parallel, version 1.4, Nov. 10, 2014 (Year: 2014).*

International Search Report and Written Opinion dated Jun. 9, 2017 for Pot application No. PCT/US2017/018834; pp. all.

First Office Action for TW Application No. 106107449, dated Jan. 25, 2018, pp. all.

English translation of First Office Action for Japanese Application No. 2018-546602 dated Aug. 27, 2019.

* cited by examiner

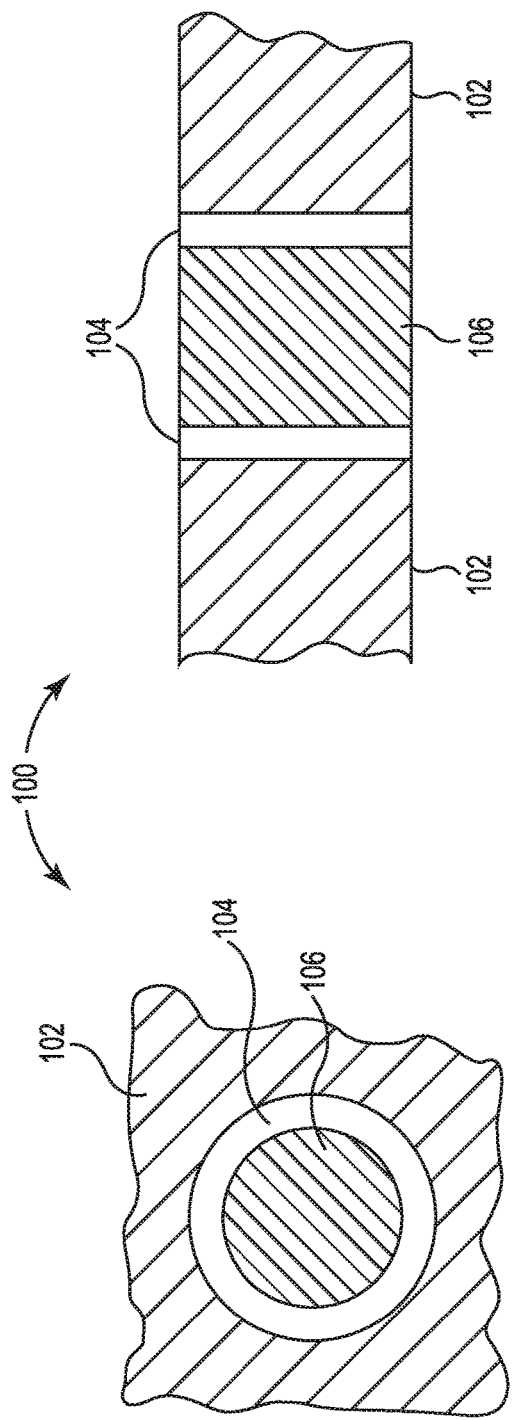

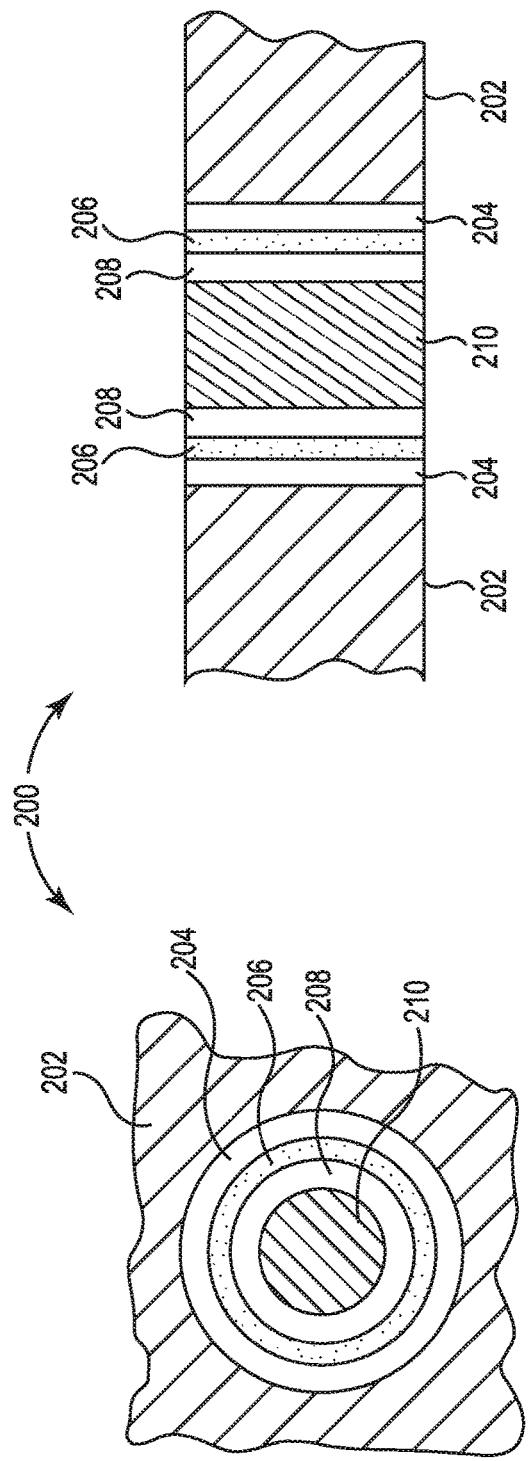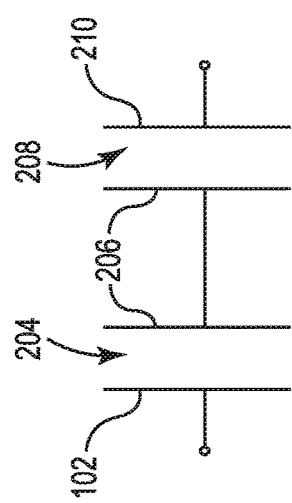
Fig. 2A  Fig. 2B  Fig. 2C

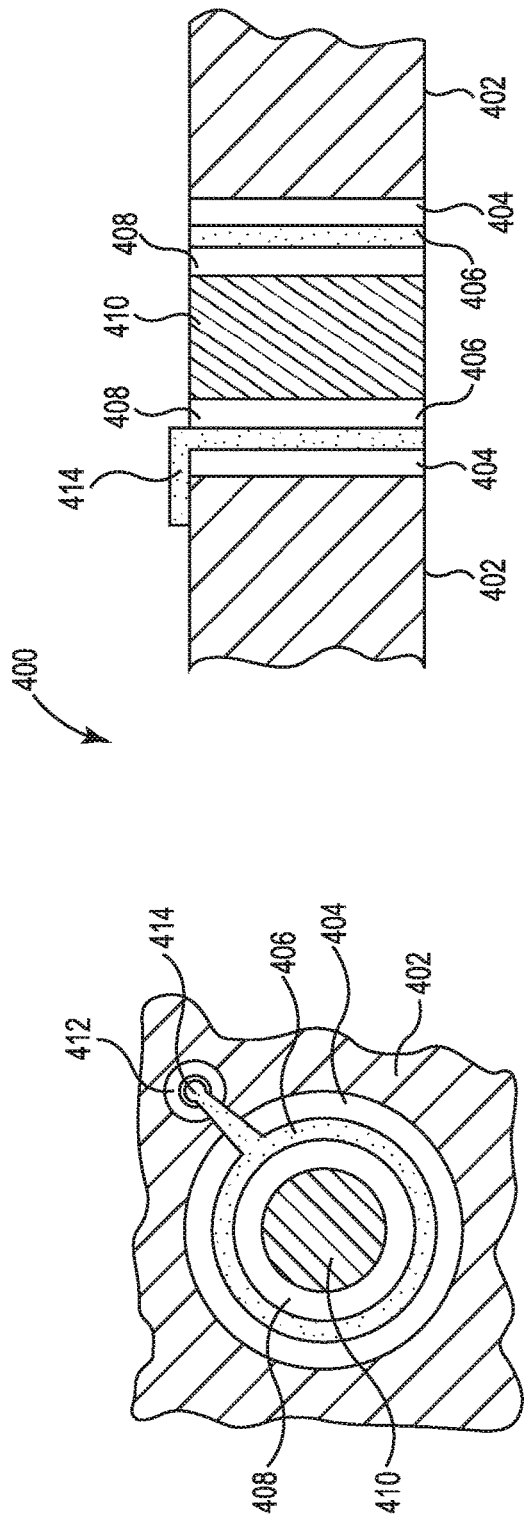
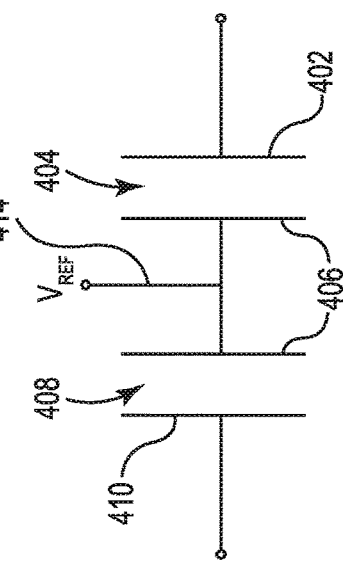
Fig. 4A  Fig. 4B  Fig. 4C

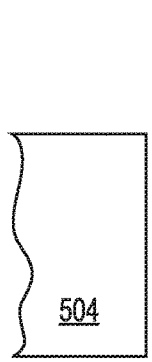
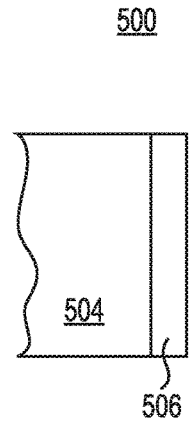
Fig. 5A　　　　　Fig. 5B
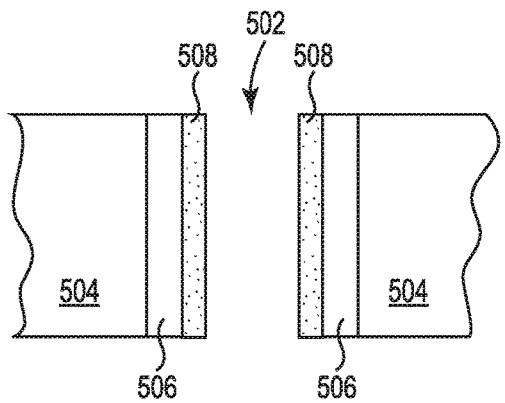
Fig. 5C
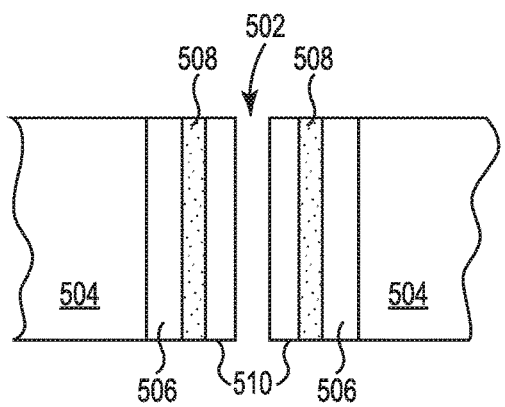　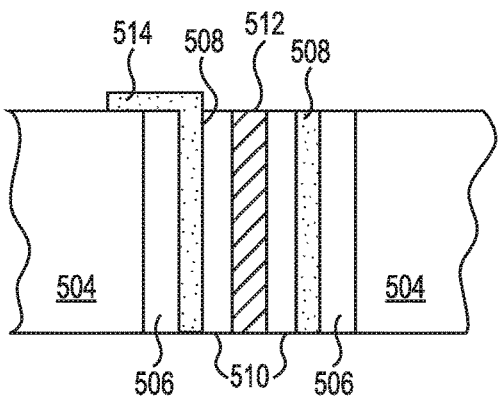
Fig. 5D　　　　　Fig. 5E

LOW CAPACITANCE THROUGH SUBSTRATE VIA STRUCTURES

BACKGROUND

Semiconductor devices that include through substrate conductive paths may have concerns regarding reliability and performance. The reliability issues, for example, may be related to the added stresses associated with the materials formed in through substrate openings used for the conduction paths. Additionally, the conductive paths formed in the through substrate openings, if not optimized, may reduce operating speeds due to associated parasitic capacitances at undesirable capacitance levels, for example. Addressing both performance and reliability problems is desirable.

BRIEF DESCRIPTION OF THE DRAWINGS

FIGS. 1A through 1C provide example views and a representative schematic of a through substrate via.

FIGS. 2A through 2C provide example views and a representative schematic of a through substrate via in accordance with an embodiment of the present disclosure.

FIGS. 4A through 4C provide example views and a representative schematic of a through substrate via in accordance with an embodiment of the present disclosure.

FIGS. 5A through 5E show cross-sectional views of a substrate at various stages of a process in accordance with an embodiment of the present disclosure.

DETAILED DESCRIPTION

Figures 3A, 3B:
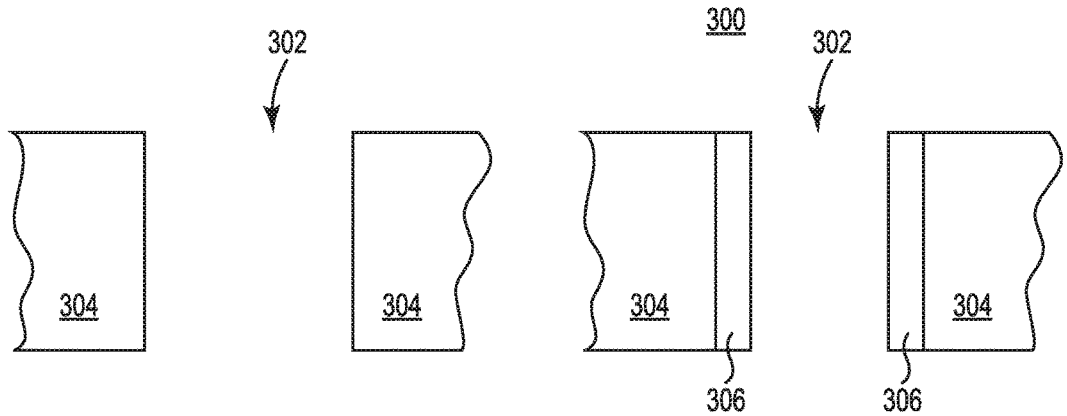
FIGS. 3A through 3E show cross-sectional views of a substrate at various stages of a process in accordance with an embodiment of the present disclosure.

Low capacitance through substrate via (TSV) structures and methods of forming the same are disclosed herein. Embodiments of the disclosure include a TSV liner formed with one or more additional capacitances between a signal-carrying conductor of the TSV and a substrate. Certain details are set forth below to provide a sufficient understanding of embodiments of the disclosure. However, it will be clear to one skilled in the art that embodiments of the disclosure may be practiced without various of these particular details. In some instances, well-known device components, circuits, control signals, timing protocols, and software operations have not been shown in detail in order to avoid unnecessarily obscuring the described embodiments of the disclosure.

Semiconductor devices are increasingly including multiple die packed together. For example, a number of die may be formed into an electrically connected stack configured to perform varying commands. To connect the stack of die, through substrate via openings may be formed in each die, where the openings provide physical paths through the die, which may subsequently be used to provide electrical connections from one side of a die to another side and to provide electrical connections between the multiple die. A conductor and various barrier and/or insulator layers may be formed in and around the through substrate via openings to form a TSV, where the TSV provides the electrical connection through the substrate. The substrate may also include one or more active layers, e.g., that may be used in forming circuits on at least one side of the substrate. The TSV structure (e.g., the physical arrangement of the various metals, insulators, and/or barrier layers), however, may have deleterious effects on the semiconductor device performance and/or reliability.

FIGS. 1A through 1C provide example views and a representative schematic of a through substrate via 100. The through substrate via (TSV) 100 may be formed in a substrate 102 and at least include a liner 104, and a conductor 106. The TSV 100 may represent some aspects of conventional TSVs and may be used to discuss problems associated with parasitic capacitance of the TSV, which may be referred to herein as the TSV capacitance, at undesirable levels.

FIGS. 1A and 1B are an example plan view and an example cross-sectional view of the TSV 100, respectively. The TSV 100 includes the liner 104 and the conductor 106, which may be consecutively formed in a through substrate via opening, which may also be referred to as a via opening for short, of the substrate 102. The combination of the liner 104 and the conductor 106 may collectively be referred to as the TSV. While the TSV 100 may include various other components (not shown), such as barrier layers and/or seed layers for example, a general TSV structure may be similar to the TSV 100.

The liner 104 may be formed from any dielectric or insulator material known in the art, such as silicon dioxide, silicon oxide, silicon nitride, low dielectric constant materials (e.g., low K dielectrics), etc. The liner 104 may be formed in the via opening by any means known in the art. The liner 104 may be used to isolate the substrate 102 from the conductor 106 to prevent any unwanted electrical coupling, e.g., shorting, between the two. The conductor 106 may be any metal known in the art, and may be used to provide a conductive path from one side of the substrate 102 to another side of the substrate 102. The conductor 106 may also provide a conductive path for interconnected die, such as a die stack. Further, for die stacks that include multiple die interconnected by one or more TSVs, such as the TSV 100, the conductor 106 may provide the conductive path for the transmission of data and/or command signals within the die stack. In such examples, the data and/or command signals may be provided by signal drivers, which may provide signals at various voltage levels. As used herein, the TSV conductor that carriers the data and/or command signals may be referred to as the active conductor.

FIG. 1C is a representative electrical schematic of the parasitic capacitance of the TSV 100. A TSV capacitance may be formed due to the physical arrangement of the substrate 102, the liner 104, and the conductor 106. For example, the TSV capacitance may be modeled as a parallel plate capacitor with the substrate 102 and the conductor 106 forming parallel plates on opposite sides of the liner 104. The TSV capacitance may affect the rate that electrical signals propagate through the TSV 100. For example, a higher TSV capacitance may reduce the rate at which signals may propagate through the conductor 106 of the TSV 100. An increase in power consumption and heat generation may also occur due to the increased TSV capacitance.

The TSV capacitance may be affected by various features of the TSV 100 such as, the thickness and/or composition of the liner 104 may affect the TSV capacitance. For example, a thick liner 104 may decrease the TSV capacitance, whereas a thin liner 104 may increase the TSV capacitance. In addition to the thickness of the dielectric 104 affecting the TSV capacitance, physical aspects of the TSV 100 may also negatively affect the TSV capacitance. Example of a physical aspect affecting the TSV capacitance may include the formation of cracks in the liner, which may be due to unsmooth or irregular features of the via opening sidewall.

Additionally, problems may be due to stresses built up in the TSV 100 structure, which may be caused by downstream processing subsequent TSV 100 formation. Cracks in the liner 104 may also be due to a mismatch of the coefficient of thermal expansion between the conductor 106 and the substrate 102, for example. Cracks formed in the liner 104 may result in metal migration, metal defect growth, and/or substrate cracking. Any of these physical defects may cause the semiconductor device to perform poorly, or not at all.

Further, since the TSV capacitance is a metal-oxide-semiconductor (MOS) capacitor, the TSV capacitance may behave as a MOS capacitor as known in the art. For example, the MOS-type capacitor may display different capacitive values at different voltages due to being in a different mode of operation, such as inversion, depletion, and accumulation. As such, the MOS-effect may cause the TSV capacitance to increase at higher voltages and/or at different frequencies of signals propagating through the conductor 106. The combination of these problems may cause a TSV capacitance value to increase above a target capacitance value, which may even occur months after fabrication.

One solution that may provide a TSV capacitance that stays at or below a target capacitance value even when the above problems are present includes adding one or more capacitors in series with the TSV capacitance. Thus, based on the rules of combining capacitances in series, a composite capacitance may always be less than each of the capacitances coupled in series. Accordingly, as long as one of the additional capacitances is at or below a target capacitance value, the composite capacitance, which may be the TSV capacitance in some embodiments, may be lower than the target capacitance. In some embodiments, one of the additional capacitances may be coupled to a reference voltage, which may cause the TSV capacitance to be limited to a capacitance value between an active TSV metal and the reference voltage. The reference voltage may be ground, a positive voltage, a negative voltage, or floating.

FIGS. 2A through 2C provide example views and a representative schematic of a through substrate via 200 in accordance with an embodiment of the present disclosure. The TSV 200 may be formed in a substrate 202 and at least include a first liner 204, a first conductor 206, a second liner 208, and a second conductor 210. The TSV 200 may provide a low TSV capacitance due to multiple capacitances formed between the second conductor 210 and the substrate 202. While the TSV 200 is discussed as having two capacitances, the number of capacitances is not limiting and a greater number of capacitances are contemplated by the present disclosure.

FIGS. 2A and 2B are an example plane view and an example cross-sectional view of the TSV 200, respectively. The TSV 200 may be formed in a via opening formed in the substrate 202. The TSV 200 may include the first and second liners 204, 208, and the first and second conductors 206, 210. Each of the first and second liners 204, 208 and the first conductor 206 may be in the form of an annulus, e.g., a ling, which may be influenced by the shape of the via opening formed in the substrate 202. For example, a round via opening may cause concentric rings to be formed around an axis point of the opening. While the first and second liners 204, 208 and the first conductor 206 are shown as rings in FIG. 2A, the shape of these individual components are a non-limiting aspect of the present disclosure and any shape is contemplated.

In some embodiments, the first and second liners 204, 208 may be formed from similar materials, silicon dioxide for example, but the respective thicknesses may be different. For example, the first liner 204 may be any thickness that provides adequate coverage of a sidewall of the via opening including any striations and etch features, whereas the second liner 208 may be of a desired thickness. As will be discussed below, the desired thickness of the second liner 208 may be such that a target capacitance value is obtained, where the capacitance is formed with the first and second conductors 206, 210 that are on opposite sides of the second liner 208.

In some embodiments, the first conductor 206 may include metal. In some embodiments, a barrier layer and a seed layer may be included in the TSV 200 and may be formed prior to formation of the first conductor 206. For example, a barrier layer may be disposed on an exposed sidewall of the first liner 204, and a seed layer may be disposed on the barrier layer prior to formation of the first conductor 206, which may be disposed on the seed layer. The barrier layer may include tantalum, the seed layer may include copper, and the first conductor 206 may include copper or polysilicon, in some embodiments. In some embodiments, the barrier and seed layers may be the first conductor 206. For example, the first conductor 206 may be formed from a barrier layer and a seed layer.

The second conductor 210 may also include metal, which may be similar to the first conductor 206. For example, the second conductor 210 may be copper. In some embodiments, the second conductor 210 may fill an opening remaining after the formation of the second liner 208. For example, if the opening remaining after the formation of the second liner 208 is a circle, the second conductor 208 may fill the remaining area/volume of the circle. In some embodiments, the second conductor 210 may be preceded by a barrier layer, and a seed layer, which may be consecutively disposed between the second liner 208 and the second conductor 210. In some embodiments, any one of the barrier layer, the seed layer, or both may be omitted in the TSV 200.

FIG. 2C is a representative electrical schematic of the various capacitances of the TSV 200. Between the substrate 202 and the second conductor 210, there may be two capacitances formed in series. For example, a first capacitor C1 may be formed by the substrate 202, the first liner 204 and the first conductor 206. Additionally, a second capacitor C2 may be formed by the first conductor 206, the second liner 208 and the second conductor 210. The equation governing the combination of series coupled capacitances is $1/C = 1/C1 + 1/C2 + 1/C3 \ldots$ As shown, a composite capacitance of C may be less than C1, C2, C3, etc. Thus, the TSV capacitance of the TSV 200 may be $1/C1 + 1/C2$, which may be less than C1 or C2. Further, while C1, may still be affected by the problems discussed above with regards to the TSV 100, such as increasing capacitance over time due to various reliability issues, for example, C2 may not experience such problems. As such, forming the second dielectric 208 to provide a C2 at or below a target capacitance may provide a TSV capacitance that is also at or below the target capacitance, even if the capacitance level of C1 increases with voltage and/or time. In such an embodiment, capacitance C2 may be considered the TSV capacitance.

FIGS. 3A through 3E show cross-sectional views of a substrate at various stages of a process 300 according to an embodiment of the present disclosure. The FIGS. 3A-3E may depict a fragment of a substrate after one or more process steps, such as steps of a method 600 (discussed below in more detail), have been performed. As used with reference to FIGS. 3A-3E, the general term "substrate" may refer to the substrate and the various other components formed thereon up to that step of the process 300. For example, stating that the substrate may be heated, would mean that the substrate and all components formed thereon to that stage be heated.

FIG. 3A shows a through substrate via opening 302, a via opening for short, formed through a substrate 304. In some embodiments, the via opening 302 may only be formed partially through the substrate 304. The via opening 302 may be formed using wet or dry etching techniques, such as ion milling, laser ablation, inductively coupled reactive ion etching, or any method known in the art. The via opening 302 may provide an opening for forming various structures through the substrate 304, such as TSVs. The TSVs, as used herein, may include one or more barrier layers, one or more liners, and one or more conductors. The TSV 200 may be an example of a TSV formed by the process 300. In some embodiments, the TSVs may include one or more liners and one or more conductors.

In some embodiments, the via opening 302 may be formed after front side processing has occurred, which may provide an active area on a top surface of the substrate 304, for example. In some embodiments, the substrate 304 may be silicon, germanium, a silicon-containing material, or combinations thereof. In some embodiments, the substrate 304 may be any semiconductor material other than silicon, such as gallium arsenide, indium phosphide, gallium nitride, etc. The active area (not shown) may include one or more layers of active circuit elements, such as transistors, capacitors, and resistors, which have been formed during one or more integrated circuit processes, as is known in the art.

FIG. 3B shows a first liner 306 formed on one or more sidewalk of the through substrate via opening 302. In some embodiments, portions of the first liner 306 may be formed on a top surface of the substrate 304 in addition to the one or more sidewalls of the through substrate via opening 302. In embodiments where at least portions of the first liner 306 are formed on the top surface of the substrate 304, those portions may be subsequently removed in an etch process. The first liner 306 may be a first TSV liner having a thickness from 1100 Å to 6000 Å or more on the one or more sidewalls of the through substrate via opening 302 in some embodiments. The first liner 306 may be an insulator, an oxide for example, and may also provide a protective layer separating the substrate 304 and an active layer contained thereon from a later formed component of the TSV, such as a TSV conductor (see FIGS. 3C and 3E, for example). The first liner 306 may be formed using a deposition process, such as chemical vapor deposition (CVD), for example. In some embodiments, the first liner 306 may be formed with a CVD an ozone (O3) tetraethylorthosilicate (TEOS) oxide process, or a plasma enhanced CVD (PECVD) deposition process, in some embodiments, the first liner 306 may be a thick layer of high quality dielectric, which may prevent metal migration and contamination of the substrate 304.

Figure 3C:
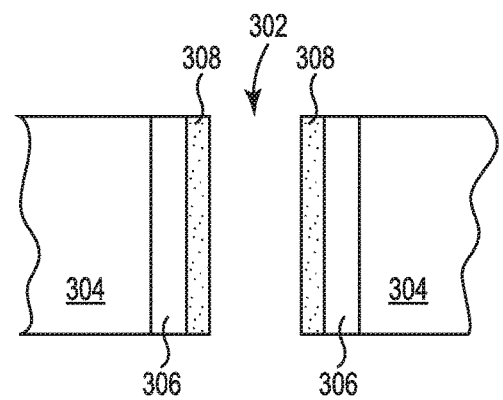

FIG. 3C shows a first conductor 308 formed on the first liner 306. The first conductor 308 may be any conductive metal known in the art, e.g., polysilicon, copper, aluminum, silver, etc., and deposited by any known means. For example, the first conductor 308 may be copper deposited through thermal evaporation or grown using electroplating. In some embodiments, in addition to the first conductor 308, a barrier layer and seed layer may be formed on the first liner 306 prior to formation of the first conductor 308. For example, a tantalum barrier layer and a copper seed layer may be sequentially deposited prior to the deposition of the first conductor 308, which may also be copper. In some embodiments, the first conductor 308 may be formed from the barrier and seed layers. Generally, a thickness of the first conductor 308 may be any desired thickness so long as a continuous layer is formed over the first liner 306. For example, the first conductor 308 may be around 20 nm.

Figures 3D, 3E:
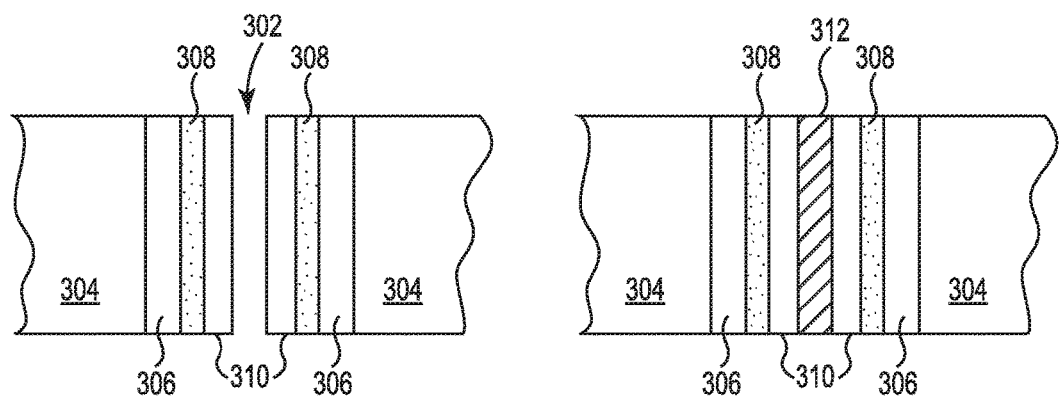

FIG. 3D shows a second liner 310 formed on the first conductor 308. The second liner 310 may be a second TSV liner, and may have a desired thickness based on a target TSV capacitance. For example, in embodiments that include first and second capacitances C1 and C2, such as the TSV 200, the capacitive value of the capacitance C2 may be based on a thickness of the second liner 310. In some embodiments, the second liner 310 may have a thickness of around 3500 Å. In general, the thickness of the second liner may be based on a desired TSV capacitance value, and the 3500 Å is only an example. The second liner 310 may be an insulator similar to the first liner 306. The second liner 310 may be formed using a deposition process, such as CND, for example. In some embodiments, the second dielectric layer 310 may be formed with a CVD O3/TEOS oxide deposition process, or a PECVD deposition process. In some embodiments, the second liner 310 may be a low dielectric constant material. For example, the second liner 310 may be polymer-based or a porous oxide, such as xerogels and aerogels.

FIG. 3E shows a second conductor 312 formed in the remaining volume of the through substrate via opening 302. The second conductor 312 may be deposited on the second liner 310. The second conductor 312 may be formed from one or more metals, copper for example. The second conductor 312 may be deposited using various metal deposition processes. In some embodiments, a tantalum barrier layer and a copper seed layer may be deposited on the second liner 310 before formation of the second conductor 312. For example, a tantalum barrier layer may be deposited using a physical vapor deposition (PVD) process, then a copper seed layer may be formed using PVD before the remaining volume is filled with copper using an electro plating process.

While FIGS. 3A-3E show the formation of an example TSV extending completely through the substrate 304, the formation of the TSV may instead occur partially from a front side of the substrate 304 before being completed from a backside of the substrate 304. For example, a TSV formed partially through the substrate may be completed by removing a thickness from the backside of the substrate until the TSV formed partially through the substrate is exposed on the backside. In either process sequence, the resulting TSV may appear substantially as depicted in FIGS. 3A-3E. Additionally, the resulting TSV may have a characteristic TSV capacitance that is generally defined by the second dielectric 310, e.g., C2, as discussed with regards to FIG. 2C. Although a capacitance formed by the first dielectric 306, e.g., C1, may contribute to the TSV capacitance, the series combination of the two capacitances, e.g., the TSV capacitance, may be less than or equal to C1 and C2.

FIGS. 4A through 4C provide example views and a representative schematic of a through substrate via 400 in accordance with an embodiment of the present disclosure. The TSV 400 may be formed in a substrate 402 and at least include a first liner 404, a first conductor 406, a second liner 408, and a second conductor 410. The TSV 400 may additionally include a conductive coupling 414 that electrically couples the first conductor 406 with a voltage reference node 412. The TSV 400 may provide a low TSV capacitance at least due in part to the first conductor 406 being coupled to the voltage reference node 412. A capacitance formed from the combination of the first and second conductors 406, 410 and the second liner 408 may be the TSV capacitance due to the first metal being coupled to the voltage reference node 412. Accordingly, shorting the first conductor 406 to the substrate 402 may limit or omit the effect the capacitance formed between the substrate 402 and the first conductor 406 from the TSV capacitance. While the TSV 400 shows the conductive coupling 414 as a single elongated conductive trace, any shape or numbers of couplings for the conductive coupling 414 are contemplated by the present disclosure.

FIGS. 4A and 4B are an example plan view and an example cross-sectional view of the TSV 400, respectively. The TSV 400 may be formed in a via opening etched in the substrate 402. The TSV 400 may include the first and second liners 404, 408, the first and second conductors 406, 410, and the conductive coupling 414. While the conductive coupling 414 may be described as being a part of the TSV 400, the conductive coupling 414 may also be disclosed as a separate component that provides a reference voltage to the first conductor 406 in order to isolate two capacitances of the TSV 400. Each of the first and second liners 404, 408 and the first conductor 406 may be in the form of an annulus, e.g., a ring, which may be due to the shape of the via opening formed in the substrate 402, and which may form concentric rings around an axis point of the opening. While the first and second liners 404, 408 and the first conductor 406 are shown as rings, the shape of these components are a non-limiting, aspect of the present disclosure and any shape is contemplated.

In some embodiments, the first and second liners 404, 408 may be formed from similar materials, silicon dioxide for example, but their respective thicknesses may be different. For example, the first liner 404 may be any thickness that provides adequate coverage of a sidewall of the via opening including any striations and etch features, whereas the second liner 408 may be of a desired thickness. As will be discussed below, the desired thickness of the second liner 408 may be such that a target capacitance value is obtained, where the capacitance is formed from the combination of the first and second conductors 406, 410 that are on opposite sides of the second liner 408.

In some embodiments, the first conductor 406 may include metal. In some embodiments, a barrier layer and a seed layer may be included in the TSV 400 and may be formed prior to formation of the first conductor 206. For example, a barrier layer may be disposed on an exposed sidewall of the first liner 404, and a seed layer may be formed on the barrier layer prior to formation of the first conductor 406, which may be disposed on the seed layer. The barrier layer may include tantalum, the seed layer may include copper, and the first conductor 406 may include copper, in some embodiments. In some embodiments, the barrier and seed layers may be the first conductor 406. For example, the first conductor 406 may be formed from a barrier layer and a seed layer.

The second conductor 410 may include a metal, which may be similar to the first conductor 406. For example, the second conductor 210 may be copper. In some embodiments, the second conductor 410 may fill an opening remaining after the formation of the second liner 408. For example, if the opening remaining after the formation of the second liner 408 is a circle, the second conductor 408 may fill the circle. In some embodiments, the second conductor 410 may be preceded by a barrier layer, and a seed layer, which may be consecutively disposed between the second liner 408 and the second conductor 410. In some embodiments, any one of the barrier layer, the seed layer, or both may be omitted in the TSV 400.

The TSV 400 may further include the conductive coupling 414. The conductive coupling 414 couples the first metal 406 to a voltage reference node 412. The voltage reference node may be formed on the substrate 402 and provide a voltage reference. In some embodiments, the voltage reference may be ground. In some embodiments, the voltage reference may be a substrate voltage, which may be a constant positive or negative voltage. In general, the reference voltage may not be based on electrical signals carried on the second metal 410, for example.

The conductive coupling 414 may be deposited with the deposition of the first conductor 406 and formed into the shape shown in FIGS. 4A and 4B during a subsequent mask step through a photolithography and etch or lift-off process, for example. In some embodiments, the conductive coupling 414 may be formed after the TSV 400 is formed. Additionally, the voltage reference node 412 may be formed on the substrate 402 during formation of active elements as discussed above.

FIG. 4C is a representative electrical schematic of the various capacitances created by the TSV 400. Between the substrate 402 and the second conductor 410, there may be two capacitances formed in series. For example, a first capacitor C1 may be formed by the substrate 402, the first liner 404, and the first conductor 406. Additionally, a second capacitor C2 may be formed by the first conductor 406, the second liner 408, and the second conductor 410. However, due to the conductive coupling 414, the first and second capacitances may be isolated from one another so that they do not combine as they would without the conductive coupling 414 being present and coupled to a voltage reference. Accordingly, the second capacitance C2 may be the capacitance that affects the TSV capacitance. Because the first conductor 406 is coupled to the voltage reference node, the first capacitor C1 may be effectively isolated from the second capacitor C2, and only the second capacitor C2 may contribute to the TSV capacitance. As such, the second capacitor C2 and the TSV capacitance may be the same. Further, while C1 may still be affected by the problems discussed above with regards to the TSV 100, C2 may not experience such problems. Accordingly, forming the second liner 208 to provide a C2 of at or below a target capacitance and coupling the first conductor 306 to the voltage reference node may provide a TSV capacitance that is also at or below the target capacitance, even if the capacitance level of C1 varies with voltage and/or time.

FIGS. 5A through 5E show cross-sectional views of a substrate at various stages of a process 500 according to an embodiment of the present disclosure. The FIGS. 5A-5E may depict a fragment of a substrate after one or more process steps, such as steps of a method 600 (discussed below in more detail), have been performed. As used with reference to FIGS. 5A-5E, the general term "substrate" may refer to the substrate and the various other components formed thereon up to that step of the process 500. For example, stating that the substrate may be heated, would mean that the substrate and all components formed thereon to that stage are heated.

FIG. 5A shows a through substrate via opening 502, a via opening for short, formed through the substrate 504. In some embodiments, the via opening 502 may only be formed partially through the substrate 504. The via opening 502 may be formed using wet or dry etching techniques, such as ion milling, laser ablation, inductively coupled reactive ion etching, or any method known in the art. The via opening 502 may provide an opening for forming conductive elements through the substrate 504, such as TSVs. The TSVs, as used herein, may include one or more barrier layers, one or more liners, and one or more conductors. The TSV 400 may be an example of the TSVs formed by the process 500. In some embodiments, the TSVs may include one or more liners and one or more conductors.

In some embodiments, the via opening 502 may be formed after front side processing has occurred, which may provide an active area on a top surface of the substrate 504. In some embodiments, the substrate 504 may be silicon, germanium, a silicon-containing material, or combinations thereof. In some embodiments, the substrate 504 may be any semiconductor material other than silicon, such as gallium arsenide, indium phosphide, gallium nitride, etc. The active area (not shown) may include one or more layers of active circuit elements, such as transistors, capacitors, and resistors, which have been formed during one or more integrated circuit processes, as is known in the art. The active area may be capped by a chemical-mechanical planarization (CMP) stop layer (not shown).

FIG. 5B shows a first dielectric layer 506 formed on one or more sidewalk of the through substrate via opening 502. In some embodiments, portions of the first dielectric layer 506 may be formed on a top surface of the substrate 504 in addition to the one or more sidewall of the through substrate via opening 502. In embodiments where at least portions of the first liner 306 are formed on the top surface of the substrate 304, those portions may be subsequently removed in an etch process. The first dielectric layer 506 may be a first TSV liner having a thickness from 100 to 6000 Å or more on the one or more sidewalk of the through substrate via opening 502 in some embodiments. The first dielectric layer 506 may be an insulator, oxide for example, and may provide a protective layer separating the substrate 504 and an active layer from a later formed component of the TSV, such as a TSV conductor (see FIG. 5E, for example). The first dielectric layer 506 may be formed using a deposition process, such as CVD, for example, in some embodiments, the first dielectric layer 506 may be formed with a CVD O3/TEOS oxide deposition process or a PECVD deposition process.

FIG. 5C shows a first conductor 508 formed on the first conductor 506. Additionally, FIG. 5C shows a conductive coupling 514 formed over the first liner 506 and extending over a portion of the substrate 504. The portion of the conductive coupling 514 extending over the substrate 504 may be coupled to a voltage reference node formed on the substrate 504 (not shown). The first conductor 508 and the conductive coupling 514 may be any conductive metal known in the art, e.g., polysilicon, copper, aluminum, silver, etc., and deposited by any known means. For example, the first metal 508 and the conductive coupling 514 may be copper deposited through thermal evaporation. In some embodiments, in addition to the first conductor 508 and the conductive coupling 514, a barrier layer and seed layer may be formed on the first liner 506 before the first conductor 508 and the conductive coupling 514 are formed. For example, a tantalum barrier layer and a copper seed layer may be sequentially deposited prior to the deposition of the first conductor 508 and the conductive coupling 514, which may also be copper. In some embodiments, the barrier layer and the seed layer may form the first conductor 406. Generally, a thickness of the first conductor 308 may be any desired thickness so long as a continuous layer is formed over the first liner 306. For example, the first conductor 308 may be around 20 nm. In some embodiments, the first conductor 508 and the conductive coupling 514 may be formed substantially simultaneously with the conductive coupling 514, shaped in a subsequent photolithography and etch or lift-off process.

FIG. 5D shows a second liner 510 formed on the first conductor 508. The second liner 510 may be a second TSV liner, and may have a desired thickness based on a target TSV capacitance. For example, in embodiments that include first and second capacitances C1 and C2, such as the TSV 400, the capacitance C2 may be based on a thickness of the second liner 510, which may have an example thickness of around 3500 Å. The second liner 510 may be an insulator similar to the first liner 506. The second liner 510 may be formed using a deposition process, such as CVD, for example. In some embodiments, the second liner 510 may be formed with a CVD O3/TEOS oxide deposition process or a PECVD deposition process. In some embodiments, the second liner 510 may be a low dielectric constant material. For example, the second liner 510 may be a polymer-based dielectric or a porous oxide, such as xerogels and aerogels.

FIG. 5E shows a second conductor 512 formed in the through substrate via opening 502. The second metal 512 may be deposited on the second liner 510 and may fill the remaining volume of the through substrate via opening 502. The second conductor 512 may be one or more metals, copper for example. The second conductor 512 may be deposited using various metal deposition processes. For example, a tantalum barrier layer and a copper seed layer may be deposited by a PVD process before the remaining volume is filled with copper using an electro plating process.

While the conductive coupling 514 is shown as being formed during the process 500 step associated with FIG. 5C, the conductive coupling 514 may be formed in a later process. For example, after or during the formation of the second conductor 512, the conductive coupling 514 may be formed using one or more photolithography steps and associated metal etching and/or metal lift-off processes.

While FIGS. 5A-5E show the formation of the TSV extending completely through the through substrate via opening 502, the formation of the TSV may occur partially from a front side of the substrate before being completed from a backside of the substrate. For example, a TSV formed partially through the substrate may be completed by removing a thickness from the backside of the substrate until the TSV formed partially through the substrate is exposed on the backside. In either process sequence, the resulting TSV may appear substantially as depicted in FIGS. 5A-5E. Additionally, the resulting TSV may have a characteristic TSV capacitance that is generally defined by the second dielectric 510, e.g., C2 of FIG. 4C, due to the conductive coupling 514. The conductive coupling 514 may effectively isolate the TSV capacitance, e.g., the second capacitance C2, due to the conductive coupling being provided a reference voltage.

Figure 6:
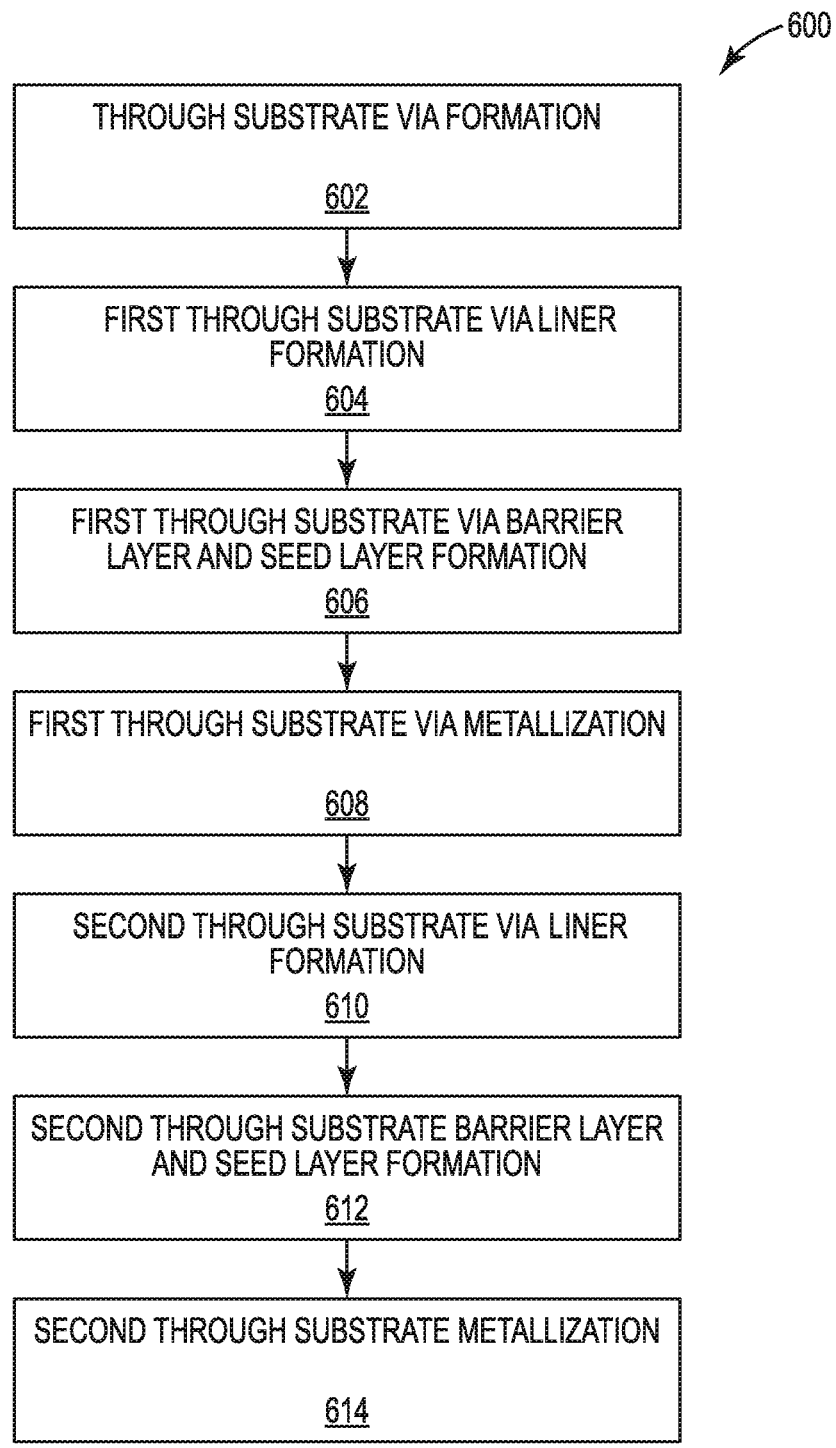
FIG. 6 is a flow diagram of a method in accordance with an embodiment of the present disclosure.

FIG. 6 is a flow diagram of a method 600 in accordance with an embodiment of the present disclosure. The method 600 may be a semiconductor processing sequence for forming a TSV with multiple capacitances. While the method 600 is disclosed as a sequence of steps 602 through 614, any number of the disclosed steps may be performed in parallel or in a different order, and/or omitted from the method 600. For example, step 612 may be omitted in some embodiments. In some embodiments, the method 600 may also include steps for forming one or more conductive couplings that couple a TSV metal with a voltage reference node. In some embodiments, the TSV may include two or more liners. At least one of the liners may be formed on sidewalk of through substrate via openings so that one or more conductors may be formed therein. At least one of the conductors may provide an electrical conductive path from one side of a semiconductor die to another, for example.

The method 600 may begin at step 602, which may include formation of a through substrate via opening in the substrate. The through substrate via opening may be formed by etching through an active area and at least partially through the substrate. The through substrate via opening may be formed in any shape desirable. For example, the through substrate via opening may be formed as a circle in the substrate. In some embodiments, the through substrate via opening may be formed completely through the substrate. Regardless, the through substrate via opening may be formed by chemical and/or physical means, with chemical etching, drilling, and laser ablation being a few examples. The through substrate via opening may be where through substrate vias (TSVs) structures are formed. A TSV structure may include one or more barrier layers and/or seed layers, one or more liners and one or more conductors so that a conductive path is formed to extend through or partially through a substrate. In some embodiments, the one or more barrier layers and one or more seed layers may be omitted. The through substrate via opening, therefore, may be the opening, e.g., a hole, formed in a substrate as a basis for a subsequently formed TSV.

In some embodiments, prior to through substrate via formation, front side processing may be performed. As used herein, front side processing may include the plurality of processing steps to form an active area of a semiconductor die. For example, front side processing may include circuit formation through numerous epitaxial growths, oxide depositions/etches, metal depositions/etches, and include numerous photolithography steps that accompany many of the depositions/etches. Subsequent to the formation of the active area, a chemical mechanical planarization (CMP) stop layer may be formed over the active area, which may protect the active area during subsequent CMP processes. The front side processing may be performed on a first side of a substrate. In some embodiments, the substrate may be silicon, germanium, or a combination thereof. In some embodiments, the substrate may be any semiconductor substrate material other than silicon, germanium, or combinations thereof.

The method 600 may continue at step 604, which may include formation of a first through substrate via opening liner, e.g., a first TSV liner. The first liner may be an insulator or a dielectric, such as silicon dioxide or silicon oxide. The liner may be formed using a chemical vapor deposition process (CVD), such as Sub Atmospheric CVD (SACVD). In some embodiments, the liner may be deposited using an ozone O3/TEOS oxide process, as may be known in the art. The O3/TEOS process may be used to form the liner on sidewalls of the through substrate via opening, and may also form a liner on a top side of the substrate. Due to the potentially steep sidewalk and the depth of the through substrate via opening, it may be desirable for the first liner to provide adequate step coverage. For example, the first TSV liner may have a thickness from 1500 to 6000 Å at the sidewall. In some embodiments, the desired step coverage of the first liner may be obtained with the O3/TEOS oxide process. In some embodiments, the first TSV liner may be deposited using a PECVD oxide process, which may provide a more dense liner.

The method 600 may continue at step 606, which may include formation of a through substrate via barrier layer and a seed layer. The barrier layer, for example, may be a metal deposited by vapor deposition. In some embodiments, the barrier layer may be tantalum. The seed layer, for example, may be a metal deposited by vapor deposition or grown by electroplating. In some embodiments, the seed layer may be copper. In some embodiments, the combined thickness of the barrier layer and the seed layer may be around 20 nm.

The method 600 may continue at step 608, which may include formation of a first through substrate via metallization. The first metallization may include the deposition of one or more metals using one or more metal deposition techniques. For example, the first metal layer may be formed, e.g., grown, using electroplating. In some embodiments, the first TSV metal may be copper. In some embodiments, the step 608 may be omitted such that the barrier layer and the seed layer may be the first TSV metal, and, for example, form the first conductor 206, 406 of FIGS. 2 and 4, respectively. Additionally, the step 606 and/or the step 608 may include the formation of a conductive coupling, such as the conductive coupling 414 of FIG. 4.

The method 600 may continue at step 610, which may include formation of a second through substrate via opening liner, e.g., a second TSV liner. The second liner may be formed substantially similar to the first liner, and may be a desired thickness based on a target capacitive value. For example, the second liner may be an O3/TEOS oxide film deposited over the first TSV metal, and may have a thickness of around 3500 Å. The second liner may be included to form a second capacitance within the TSV. For example, if a TSV 200 is being formed based on the method 600, the second TSV liner is formed between the first TSV metal and a second TSV metal (discussed below) to form the second capacitance C2 discussed above. The capacitive value of the second capacitance C2 may be such that a target TSV capacitance is achieved.

The method 600 may continue at step 612, which may include formation of a through substrate via barrier layer and a seed layer. The barrier layer, for example, may be a metal deposited by vapor deposition. In some embodiments, the barrier layer may be tantalum. The seed layer, for example, may be a metal deposited by vapor deposition or grown by electroplating. In some embodiments, the seed layer may be copper.

The method 600 may continue at step 614, which may include formation of a second through substrate via metallization, e.g., a second TSV metal. The second TSV metallization may include the deposition of one or more metals using one or more metal deposition techniques. For example, at least a first metal layer may be formed to fill the through substrate opening by electroplating. In some embodiments, the second TSV metal may be copper.

From the foregoing it will be appreciated that, although specific embodiments of the disclosure have been described herein for purposes of illustration, various modifications may be made without deviating from the spirit and scope of the disclosure. Accordingly, the disclosure is not limited except as by the appended claims.

What is claimed is:

1. An apparatus, comprising:
   a through substrate via formed in an opening formed through a substrate, wherein the opening has at least one sidewall and comprises:
   a first dielectric abutted against the at least one sidewall of the opening, the first dielectric including an exposed sidewall on which a barrier layer of tantalum is formed prior to formation of a seed layer of copper on the barrier layer, the first dielectric having a thickness from 1500 to 6000 angstroms thereby covering a sidewall of the opening of the through substrate via including striations and etch features of the at least one sidewall of the opening, the first dielectric disposed such that a top surface of the first dielectric is laterally flush with a top surface of the substrate, a first conductor abutted against the seed layer, the first conductor having a thickness of around 20 nanometers, a second dielectric at least formed on the first conductor, and a second conductor abutted against a sidewall of the second dielectric, the second conductor electroplated on a copper seed layer deposited on a tantalum barrier layer that is previously deposited on the second dielectric, the second conductor formed by filling a remaining portion of the opening formed through the substrate with copper, wherein the second dielectric is a xerogel or aerogel formed using a deposition process with a thickness of around 3500 angstroms resulting in a capacitance of the through substrate via that is lower than a capacitance value, wherein a second capacitor formed from the first and second conductors and the second dielectric such that a series combination of capacitances of both of a first capacitor formed by a combination of the substrate, the first dielectric, and the first conductor and the second capacitor is less than or equal to the capacitance of each of the first capacitor and the second capacitor, and wherein, due to the first dielectric having the thickness from 1500 to 6000 angstroms thereby covering the striations and etch features of the sidewall that otherwise result in formation of cracks in the first dielectric, and further due the first conductor having the thickness of around 20 nanometers, and further due to the second dielectric having the thickness of around 3500 angstroms, the capacitance of the through substrate via is maintained lower than the capacitance value, notwithstanding an increase in a capacitance level of the first capacitor with voltage or time after fabrication.

2. The apparatus of claim 1, wherein a conductive coupling couples the first conductor to a voltage reference node.

3. The apparatus of claim 2, wherein the voltage reference node is a ground node.

4. The apparatus of claim 2, wherein the voltage reference node is a substrate voltage node.

5. The apparatus of claim 1, wherein the first dielectric is silicon dioxide.

6. The apparatus of claim 1, further comprising a conductive coupling formed on a top surface of the first conductor, the top surface of the first dielectric, and the top surface of the substrate, wherein portions of a lower surface of the conductive coupling abutting the top surfaces of the first conductor, the first dielectric, and the substrate are co-planar, and wherein a side surface of the conductive coupling and a side surface of the first conductor are co-planar.

* * * * *